United States Patent [19]

Addis

[11] Patent Number: 4,714,896
[45] Date of Patent: Dec. 22, 1987

[54] PRECISION DIFFERENTIAL AMPLIFIER HAVING FAST OVERDRIVE RECOVERY

[75] Inventor: John L. Addis, Beaverton, Oreg.

[73] Assignee: Tektronix, Inc., Beaverton, Oreg.

[21] Appl. No.: 919,112

[22] Filed: Oct. 15, 1986

[51] Int. Cl.$^4$ .............................................. H03F 3/45
[52] U.S. Cl. .................................... 330/261; 330/252; 330/259
[58] Field of Search ................. 330/252, 259, 260, 261, 330/294

[56] References Cited

U.S. PATENT DOCUMENTS 4,528,515 7/1985 Gross .................................. 330/254

OTHER PUBLICATIONS

Robert J. DeKok et al., Monolithic Instrumentation Amplifier, Electrical Engineering, vol. 3, No. 3, Jul. 1978, pp. 225–236.

Primary Examiner—Gene Wan
Attorney, Agent, or Firm—George T. Noe

[57] ABSTRACT

A precision differential amplifier having unity-gain buffer amplifier input stages on each side of the amplifier includes a primary feedback path between the collector and base of the inside buffer amplifier transistor which operates when the differential amplifier is operated within its linear operating range. Under an overdrive signal condition, the primary feedback path is opened and a secondary feedback is activated to control the collector and base of the inside buffer amplifier transistor, thus preventing saturation of the inside buffer amplifier transistor and cutoff of the outside transistor. The primary and secondary feedback paths consist of only semiconductor junctions, minimizing heat and loading effects, reducing power supply voltage requirements, and facilitating rapid overdrive recovery.

1 Claim, 3 Drawing Figures

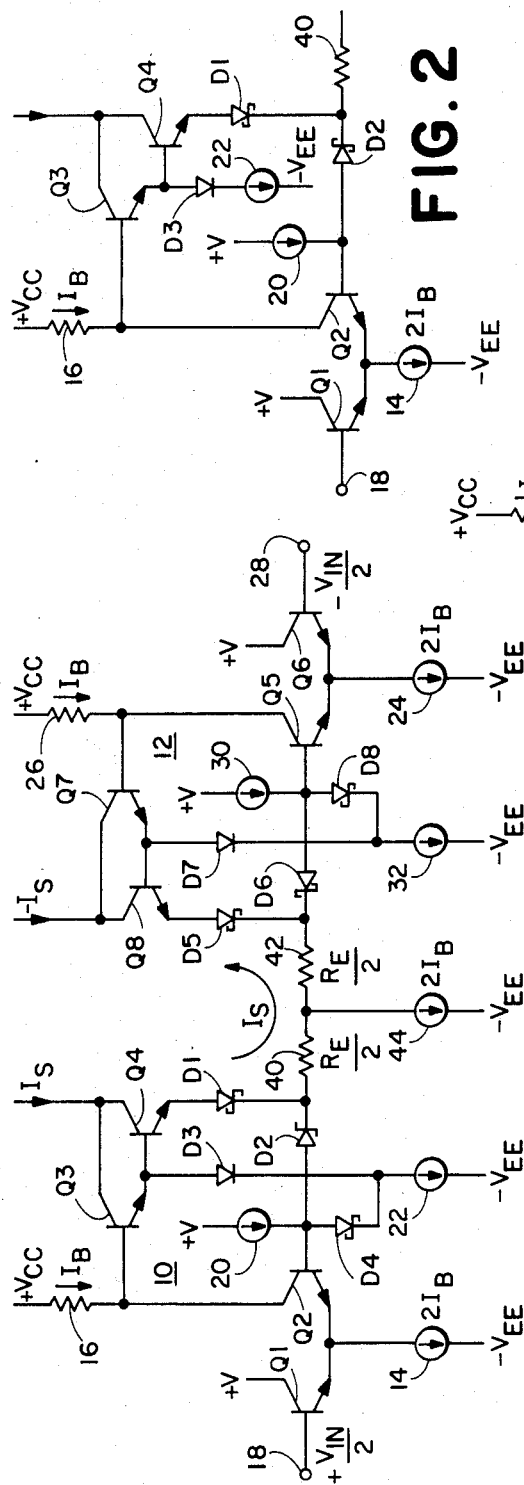

PRECISION DIFFERENTIAL AMPLIFIER HAVING FAST OVERDRIVE RECOVERY

BACKGROUND OF THE INVENTION

The present invention relates to differential amplifiers in general, and in particular to differential amplifiers having fast overload recovery.

Monolithic differential amplifiers having unity-gain buffer amplifier input stages are particularly useful in electronic measurement instruments since they not only provide very accurate replication of high-frequency differential signals with high suppression of common-mode voltages but exhibit high input impedance, low noise and low voltage offsets, and operate with relatively low supply voltages and currents.

This type of amplifier, like most amplifiers, typically has a dynamic operating range, or "input window", over which the transfer function is substantially linear. A problem arises in measuring input signals that have voltage swings outside the input window because the amplifier will be driven into a nonlinear region outside the normal operating range, perhaps resulting in an overload that may saturate or cut off a transistor. Also, unbalanced operation due to an overload will result in different power dissipation in the form of heat in some transistors.

Consequently, recovery from the non-linear region following an overdrive condition is delayed not only by the charging or discharging of inherent capacitances, but by thermal changes that continue to distort waveforms until thermal equilibrium is achieved.

One solution to this problem is offered in pending application Ser. No. 06/909,437, filed Sept. 19, 1986, and assigned to the assignee of the present invention. While transistor saturation is prevented and recovery time is substantially reduced, the clamp network added to the basic circuit requires two resistors and an additional transistor on each side of the differential amplifier. It would be desirable to lower the parts count and power supply requirements, and to eliminate heat-producing resistors and the loading that such resistors represent.

SUMMARY OF THE INVENTION

In accordance with the present invention, a precision differential amplifier having unity-gain buffer amplifier input stages includes a primary feedback path between the collector and base of the inside buffer amplifier transistor which operates when the amplifier is operated within its linear operating range, and a secondary feedback path which controls the collector and base of the inside buffer amplifier transistor to prevent saturation thereof when overdriven. The feedback paths consist of only semiconductor junctions, minimizing heat and loading effects, and facilitating rapid overdrive recovery.

It is therefore one object of the present invention to provide a precision differential amplifier which recovers from an overdriven condition to a linear operating range with almost negligible delay.

It is another object of the present invention to provide an improved differential amplifier with an overdrive recovery circuit having reduced power supply voltage requirements and fewer components.

Other objects, features, and attainments of the present invention will become obvious to one having ordinary skill in the art upon a reading of the following detailed description when taken in conjunction with the accompanying drawings.

THE DRAWINGS

FIG. 1 is a schematic diagram of a differential amplifier incorporating the overdrive recovery circuit of the present invention;

FIG. 2 is a partial schematic diagram depicting one side of the amplifier of FIG. 1 wherein the primary feedback path is conducting to provide normal linear operation; and FIG. 3 is a partial schematic diagram depicting one side of the amplifier of FIG. 1 wherein the secondary feedback path is conducting to provide control under an overdrive condition.

DETAILED DESCRIPTION OF THE INVENTION

Referring to FIG. 1 of the drawings, there is shown a high-frequency differential amplifier having a left half 10 and a right half 12. The left half comprises a unity-gain buffer input amplifier including a pair of emitter coupled transistors Q1 and Q2 and a Darlington connected pair of transistors Q3 and Q4 coupled between the collector and base of Q2. The emitters of Q1 and Q2 are returned to a suitable negative supply voltage $-V_{EE}$ through a constant current generator 14, which sinks a current $2I_B$ split equally between transistors Q1 and Q2. The collector of transistor Q1 is connected to a suitable positive supply voltage $+V$, while the collector of Q2, in addition to being connected to the base of transistor Q3, is coupled to a positive supply voltage $+V_{CC}$ through a load resistor 16. The base of transistor Q1 is connected to an input terminal 18. The emitter of transistor Q4 is returned to the base of transistor Q2 through a first pair of diodes D1 and D2, and the emitter of transistor Q3 is also returned to the base of transistor Q2 through a second pair of diodes D3 and D4. The operation and switching of these diodes will be discussed later. A constant current generator 20, operating as a current source, is connected to the anodes of diodes D2 and D4 and the base of transistor Q2, while constant current generator 22, operating as a current sink, is connected to the cathodes of diodes D3 and D4.

Likewise, the right half 12 of the differential amplifier comprises a unity gain buffer input amplifier including a pair of emitter coupled transistors Q5 and Q6 and a Darlington connected pair of transistors Q7 and Q8 coupled between the collector and base of transistor Q5. The emitters of Q5 and Q6 are returned to the negative supply $-V_{EE}$ through constant current generator 24, which sinks a current $2I_B$ split equally between transistors Q7 and Q8. The collector of transistor Q6 is connected to positive supply $+V$, while the collector of transistor Q5, in addition to being connected to the base of transistor Q7, is coupled to a positive supply voltage $+V_{CC}$ through a load resistor 26. The base of transistor Q6 is connected to an input terminal 28. The emitter of transistor Q8 is returned to the base of transistor Q5 through a third pair of diodes D5 and D6, and the emitter of transistor Q7 is returned to the base of transistor Q5 through a fourth pair of diodes D7 and D8. A constant current generator (current source) 30 is connected to the anodes of diodes D6 and D8, while constant current generator (current sink) 32 is connected to the cathodes of diodes D7 and D8.

The two halves of the differential amplifier are coupled together by resistors 40 and 42 connected in series between the emitters of transistors Q4 and Q8. The junction of resistors 40 and 42 is connected to a constant current generator 44 operated as a current sink to divide a current $2I_E$ between transistors Q4 and Q8. It should be noted that this "T" configuration was implemented in the preferred embodiment as a matter of design choice, and that resistors 40 and 42 and current generator 44 could be replaced by a single resistor and separate current generators coupled to the emitters of transistors Q4 and Q8.

In normal operation of the differential amplifier, an input signal $V_{IN}$ is applied across the input terminals 18 and 28, transmitted to the bases of transistors Q2 and Q5, and developed across resistors 40 and 42 to produce signal current $I_S$, which is output via the collectors of transistors Q4 and Q8. With both inputs 18 and 28 balanced at equal voltage, current $2I_E$ produced by current generator 44 is split equally between resistors 40 and 42 so that both halves of the differential amplifier conduct equally, and the signal current $I_S$ is equal to zero. Signal current $I_S$ is produced when the input voltages at terminals 18 and 28 are different.

To understand the mechanism completely, consider for the moment just the left half 10 of the differential amplifier. With a small signal applied to input terminal 18, the emitter of transistor Q1 follows the input, causing a small change in the collector current of transistor Q2, hence causing a small change in the voltage at the base of transistor Q3. This small change is transmitted by emitter follower action of transistors Q3 and Q4, and by conducting diodes D1 and D2 back to the base of transistor Q2. Assuming equal voltage drops for all of the semiconductor junctions in the circuit (Q3 and Q4 base-emitter, and all the diodes), the potential at the cathode of diode D3 is equal to the potential at the emitter of transistor Q4, and hence at the base of transistor Q2, resulting in diode D4 being cut off.

As described in the preceding paragraph for normal operating conditions, the left hand 10 of the differential amplifier is as shown in FIG. 2. That is, the base-emitter junctions of transistors Q3 and Q4 and diodes D1 and D2 form a primary feedback path from collector to base of transistor Q2 for normal linear operation. Current source 20 furnishes constant current for conduction of diode D2, while current sink 22 ensures conduction of transistor Q3.

Now let us assume that the signal at terminal 18 (the base of Q1) is pulled negative with respect to the voltage potential at terminal 28 (the base of Q6) by a large negative-going voltage swing which is equal to, or greater than, the product $I_E R_E$. In such a case, all of the current $2I_E$ produced by current generator 44 flows through resistor 42, and none flows through resistor 40, cutting off diodes D1 and D2 and transistor Q4, opening the primary feedback path. However, as this action occurs, diode D4 turns on, providing a secondary feedback path from the collector to base of Q2 via the base-emitter junction of transistor Q3 and diodes D3 and D4.

As described in the preceding paragraph for a large negative-going voltage swing at input terminal 18, the left half 10 of the differential amplifier is as shown in FIG. 3. The secondary feedback loop keeps transistor Q2 from saturating and transistor Q1 from cutting off as the entire unity-gain buffer stage slews negative with the input signal. This action also prevents a difference in power dissipation in the form of heat in transistors Q1 and Q2. Thus, quick recovery is allowed following an overdrive condition because there are no saturation or thermal effects to overcome.

In the overdriven condition, the gain of the differential amplifier is zero and the output is not affected by the overdriving signal. The output currents for the overload described are $2I_E$ via transistor Q8 on the right side and current from current generator 22 via transistor Q3 on the left side. If the right half of the differential amplifier is the side driven negative, e.g., transistor Q6 base pulled negative, then $2I_E$ flows through Q4 while current from current generator 32 flows through Q7.

While I have shown and described a preferred embodiment of the present invention, it will become apparent to those having ordinary skill in the art that many modifications may be made without departing from the invention in its broader aspects. For example, bipolar diodes may be substituted for the Schottky barrier diodes shown.

What I claim as being novel is:

1. A differential amplifier having two identical halves, each half comprising:
  a buffer amplifier input stage comprising an emitter coupled pair of transistors, wherein a base of a first transistor of said pair is coupled to an input terminal;
  a primary feedback path, from collector to base of a second transistor of said pair, comprising Darlington-connected third and fourth transistors and a first and second diode; and
  a secondary feedback path, from collector to base of said second transistor of said pair, comprising said third transistor and a third and fourth diode;
  wherein only one of said primary and secondary feedback paths is operable with said buffer amplifier input stage at a time;
  said halves being coupled together to form a differential amplifier wherein both said primary feedback paths conduct in a first operating condition, and wherein a secondary feedback path conducts in one of the halves in a second operating condition.

* * * * *